United States Patent
Nagashima

(10) Patent No.: US 8,847,677 B2
(45) Date of Patent: Sep. 30, 2014

(54) AMPLIFIER CIRCUIT

(75) Inventor: Yoshikazu Nagashima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 13/607,523

(22) Filed: Sep. 7, 2012

(65) Prior Publication Data

US 2013/0187710 A1 Jul. 25, 2013

(30) Foreign Application Priority Data

Jan. 25, 2012 (JP) ................. P2012-012913

(51) Int. Cl.
*H03F 1/02* (2006.01)

(52) U.S. Cl.
USPC ...................... 330/9; 330/2; 330/10

(58) Field of Classification Search
USPC ............. 330/2, 9, 10, 51, 85, 207 A, 251
See application file for complete search history.

(56) References Cited

U.S. PATENT DOCUMENTS

| | | | |
|---|---|---|---|
| 6,316,992 B1 | 11/2001 | Miao et al. | |
| 7,026,686 B2 | 4/2006 | Blomme et al. | |
| 7,924,089 B2 * | 4/2011 | Tanaka et al. | 330/9 |
| 2010/0045376 A1 * | 2/2010 | Soenen et al. | 330/251 |
| 2010/0109773 A1 * | 5/2010 | Takagi | 330/251 |

FOREIGN PATENT DOCUMENTS

JP 2004-208216 7/2004

* cited by examiner

*Primary Examiner* — Khanh V Nguyen
(74) *Attorney, Agent, or Firm* — Patterson & Sheridan, LLP

(57) ABSTRACT

According to one embodiment, an amplification circuit can be switched between amplifying and calibration modes. During calibration, a preamplifier amplifies a differential input signal and generates a differential output signal. The amplifier circuit includes an input switch unit which sets a differential input signal as the reference voltage signal of the same voltage level at the time of calibration, a PWM conversion unit which carries out Pulse-Width-Modulation of the differential output signal, and generates a differential PWM signal based on the result of comparing the differential output signal with the reference signal, a calibration unit which generates an offset adjustment signal according to the phase difference of differential PWM signals, and an electric amplifier which carries out electric power amplification of the differential PWM signal and generates the differential final output signal.

19 Claims, 12 Drawing Sheets

AMPLIFIER CIRCUIT

CROSS-REFERENCE TO RELATED APPLICATION

This application is based upon and claims the benefit of priority from Japanese Patent Application No. 2012-012913, filed Jan. 25, 2012; the entire contents of which are incorporated herein by reference.

FIELD

Embodiments described herein relate with the amplifier circuit which amplifies differential input signals.

BACKGROUND

In the mobile phone or the digital audio player, the use of class D amplifiers, which are excellent in electric power efficiency and can be miniaturized, is increasing.

In the integrated circuit class D amplifier, a DC offset is generated which is influenced by variations resulting from the manufacturing process, power supply voltage, temperature conditions to be used, aging, etc. Moreover, in a class D amplifier, although a Pulse-Width-Modulation signal (henceforth, PWM signal) is generated by calculating the difference between the input signal and a sawtooth signal or a triangular wave signal, the duty cycle of a PWM signal is also affected by the influence of the power supply voltage being used, temperature conditions, aging of the device, etc.

Although change of the DC offset by device variations can be reduced using trimming, changes in the DC offset and duty cycle caused by power supply voltage, temperature conditions, and aging cannot be reduced only with trimming technology, a thus a calibration circuit is used and the calibration of the DC offset and duty is periodically reset.

However, even if the calibration circuit is able to compensate for the DC offset and duty cycle variation which occur with the class D amplifier, it is common to prepare a deadtime generation circuit on the back-end side of the calibration circuit in order to prevent a flow-through current. The conventional calibration circuit is not able to compensate for this DC offset and duty change that arises using this dead-time generation circuit. Moreover, when a calibration circuit is prepared, there is a possibility that the scale of the circuit of a class D amplifier may become quite large depending on the circuit configuration.

DETAILED DESCRIPTION

According to the embodiment, there is provided an amplifier circuit which performs the calibration of the DC offset and duty cycle of a class D amplifier with sufficient accuracy in a simple circuit.

The amplifier circuit is provided with a preamplifier which amplifies a differential input signal and generates a differential output signal, an input switch unit, which sets a difference input signal as the reference voltage signal equal to the same voltage level at the time of calibration, a PWM conversion unit, which carries out Pulse-Width-Modulation of the differential output signal, and generates a differential PWM signal by comparing the differential output signal with the reference signal of a sawtooth wave or triangular wave, a calibration unit, which generates the offset adjustment signal according to the phase difference between the differential PWM signals at the time of calibration, and the electric amplifier, which carries out electric power amplification of the differential PWM signal, and generates the final differential output signal. The preamplifier adjusts the voltage of a differential output signal based on an offset adjustment signal so that the voltage of the differential output signal will be smaller at the time calibration is performed.

Embodiment 1

Figure 1:
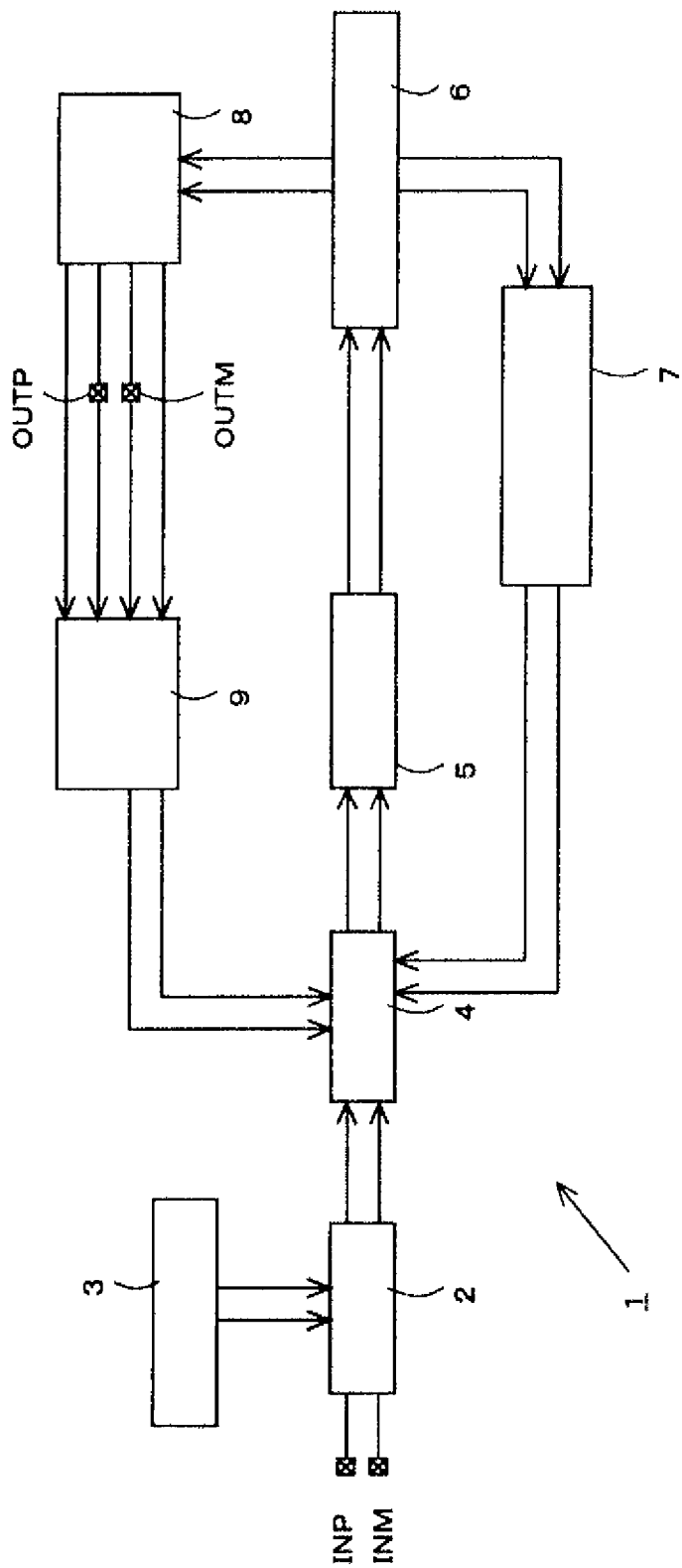
FIG. 1 is a block diagram showing the schematic structure of an amplifier circuit according to a first embodiment

FIG. 1 is a block diagram showing the schematic structure of the amplifier circuit 1 of the first embodiment. The amplifier circuit 1 of FIG. 1 is a class D amplifier that outputs a PWM (pulse wave modulated) signal for each differential input signal from terminals INP, INM. It amplifies these PWM signals and generates differential output signals OUTP and OUTM. Also, amplifier circuit 1 carries out DC offset correction and duty cycle correction (hereafter, generally called calibration) of a PWM signal arising in each unit of the amplifier circuit 1. Although only one DC offset correction or duty cycle correction may be performed, the embodiment below explains the example which performs DC offset correction and duty cycle correction in parallel.

Calibration is carried out independently of the use of the amplifying circuit as a class D amplifier. During calibration, the INP and INM signals are decoupled from the circuit, and a reference voltage Vref is applied in place of the INP and INM signals. The circuit is then calibrated, which includes both phase (duty cycle) calibration and a DC offset calibration. The calibration is terminated, and the INM and INP source signals are then again supplied to the input side of the amplifier, and the new, calibrated phase and DC offset signals are used to form a PWM output from the inputs.

The amplifier circuit 1 of FIG. 1 is equipped with an input switching unit 2, a reference voltage generator 3, a preamplifier unit 4, a PWM conversion unit 5, a calibration unit 6, a D/A converter 7 for calibrations, an electric power amplification unit 8, and a feedback amplification unit 9.

The input switching unit 2 sets a differential input signal as the reference voltage signal Vref of the same voltage level which was set at the time of calibration. The preamplifier unit 4 amplifies the difference input signal switched in the input switching unit 2, and generates a differential output signal. Comparing this differential output signal with the standard sawtooth or triangle, the PWM conversion unit 5 carries out Pulse-Width-Modulation of the differential output signal and generates a differential PWM signal.

The calibration unit 6 generates the digital offset adjustment signal and a digital duty adjustment signal of the PWM signal according to the phase difference of differential PWM signals set at the time of calibration.

The D/A converter 7 for calibration generates the analog offset adjustment signal which carries out analog conversions of the digital offset adjustment signal and the analog duty adjustment signal which carries out analog conversion of the digital duty adjustment signal at the time of calibration. The electric power amplification unit 8 carries out electric power amplification of the differential PWM signal and generates the final differential output signals OUTP and OUTM.

The preamplifier unit 4, at the time of calibration, adjusts the voltage level of differential output signals AinP, AinM based on an analog offset adjustment signal so that the voltage difference of differential output signals AinP, AinM may be decreased based on the analog offset adjustment signal. The duty cycle of one side of the differential PWM signal is adjusted so that it and a reference clock signal may be in agreement based on the analog duty cycle adjustment signal.

Figure 2:
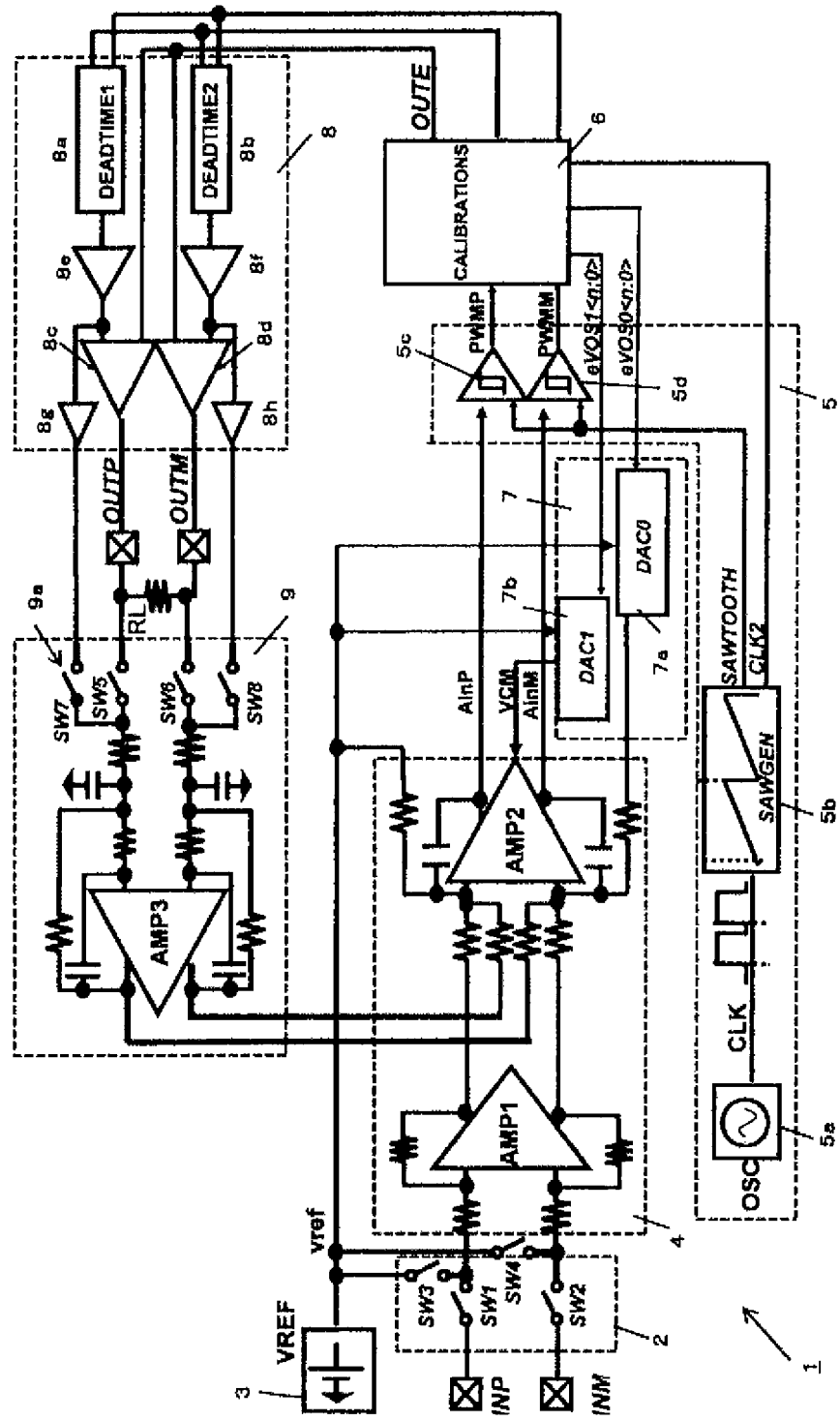
FIG. 2 is a detailed circuit diagram of the amplifier circuit of FIG. 1.

FIG. 2 is a detailed circuit diagram of the amplifier circuit 1 of FIG. 1. The input switching unit 2 has first switch circuits SW1, SW2 and second switch circuits SW3, SW4. The reference voltage generator 3 generates the reference voltage signal Vref input into the preamplifier unit 4 at the time of calibration.

The first switch circuits SW1 and SW2 are switched based upon whether or not the differential input signals INP, INM are to be input into the preamplifier unit 4. More specifically, the first switch circuits SW1 and SW2 input the differential input signal input to the differential input terminals INP, INM into the preamplifier 4 at the time of normal operation. Further, the first switch circuits SW1 and SW2 are switched to an off position (as shown within dashed line box 2 in FIG. 2) to prevent the differential input signals INP, INM from being passed into the preamplifier 4 at the time of calibration. Since a differential input signal is no longer input into the preamplifier unit 4 at the time of calibration, the circuit enters a mute period (non-signal state). The second switch circuits SW3 and SW4 are switched based upon whether or not the reference voltage signal Vref, generated by the reference voltage generator 3, is input into the preamplifier unit 4. More specifically, the second switch circuits SW3 and SW4 are kept from inputting the reference voltage signal Vref into the preamplifier unit 4 at the time of normal operation, i.e., when switches SW1 and SW2 are in the closed position). The reference voltage signal Vref is thus input into the preamplifier unit 4 only at the time of calibration.

The preamplifier unit 4 includes a front-end amplifier AMP1 and a back-end amplifier AMP2 to which cascaded connections are made. The differential input signal switched in the input switching circuit 2 is connected to the difference input terminal of the front-end amplifier AMP1. During normal operation, the differential input signal from the differential input terminals INP, INM are input to the difference input terminal of the front end amplifier AMP1, and during calibration periods the reference voltage signal Vref generated by the reference voltage generator 3 is input to the difference input terminal of the front end amplifier AMP1. The front-end amplifier AMP1 amplifies the signal inputted into the difference input terminal at a predetermined amplification rate, generates a first differential output signal, and supplies it to the back-end amplifier AMP2.

The difference input terminal of the back-end amplifier AMP2 is connected to the first differential output terminal of the front-end amplifier AMP1, and also to a differential output terminal of the feedback amplifier unit 9. Therefore, the differential input signal of the back-end amplifier AMP2 turns into a signal which amplifies the differential output signal of front-end amplifier AMP1 with the differential output signal of the feedback amplifier unit 9.

Moreover, the output terminal of first DAC7a in D/A converter 7 is, for calibration, connected to one side of the difference input terminal on the back-end amplifier AMP2, and, thereby, correction of the DC offset of the amplifier circuit 1 is performed using it. Furthermore, the output terminal of the second DAC7b in D/A converter 7 is, for calibration, connected to the VCM terminal on the back-end amplifier AMP2, and, thereby, duty cycle correction of a differential PWM signal is performed. Details of DC offset correction and duty cycle correction are discussed later herein.

The PWM converting unit 5 includes a reference oscillator 5a, a sawtooth wave signal generator 5b, a first comparator 5c, and a second comparator 5d. The sawtooth wave signal generator 5b generates sawtooth wave signals and reference clock CLK2 signals with the same duty and frequency as the sawtooth wave signal and are based on the reference clock CLK signal generated by the reference oscillator 5a. In addition, a reference clock CLK signal is a clock signal with only 50% duty guaranteed.

The first comparator 5c compares the voltage of one of the differential output signal of the preamplifier unit 4 and a sawtooth wave signal, and generates a PWMP signal using that comparison. The second comparator 5d compares the voltage between another side of the differential output signal of the preamplifier unit 4 and a sawtooth wave signal, and generates a PWMM signal using that comparison.

The calibration unit 6 generates the digital offset adjustment signal and the digital duty cycle adjustment signal.

The electric power amplifier unit 8 includes dead-time generation units 8a and 8b, main drivers 8c and 8d, and sub-drivers 8e, 8f, 8g, and 8h for preventing current flows between the power supply terminal and the ground terminal. The output stage of the main drivers 8c and 8d and the sub-drivers 8e, 8f, 8g, and 8h adjusts the timing of the signal input to the gate of each transistor in the dead-time generation unit 8a and 8b, such that a PMOS transistor and a NMOS transistor are connected in series between the power supply terminal and the ground terminal, and that both transistors may turn on simultaneously and prevent current flowing between the power supply terminal and the ground terminal. More specifically, the dead-time generation units 8a and 8b create a dead-time period when both transistors are certainly turned off, to block current flow between the power supply terminal and the ground terminal while both transistors switch ON to OFF or OFF to ON.

The main drivers 8c and 8d receive the indicated OUTE signal from the calibration unit 6 during both calibration and normal operation of the amplifier 1. The main drivers 8c and 8d distinguish between periods of calibration and normal operation according to the logic of the OUTE signal. During calibration, the differential output terminal of main drivers 8c and 8d are changed into a high impedance state, but during normal operation, the differential output signals OUTP and OUTM, according to a differential input signals, are output therefrom. The electric power amplifier unit 8 supplies output signals of main drivers 8c and 8d, and sub-drivers 8g and 8h to the feedback amplifier unit 9.

Although the main drivers of 8c and 8d, at the time of normal operation, output a differential signal in the form of a rectangular wave signal, if loads such as a loudspeaker, are connected to a differential output terminal, a low pass filter will be formed in equivalent and as a result the voltage will change continuously from the fact that the inductor ingredient is contained in the load in equivalent. The amplifier circuit 1 concerning this embodiment can be used with a loudspeaker, a hearing-aid, etc. in order to reproduce an audio signal.

The feedback amplifier unit 9 has an input selection unit 9a and feedback amplifier ANP3. The input selection unit 9a chooses either of the output signals of sub-drivers 8g and 8h supplied from the electric power amplifier unit 8, or the output signal of main drivers 8c and 8d. Since the output signal of main drivers 8c and 8d becomes high impedance at the time of calibration, the input selection unit 9a then chooses the output signal of sub-drivers 8g and 8h, and chooses the output signal of main drivers 8c and 8d during normal operation of the amplifier 1.

The feedback amplifier AMP3 amplifies the differential signal which the input selection unit 9a chose with a predetermined amplification factor, and it returns to the input side of the back-end amplifier AMP2 in the preamplifier unit 4.

The feedback amplifier unit 9 is not necessary, and may be omitted. However, since it becomes impossible to monitor the differential final output signals OUTP and OUTM when the feedback amplifier unit 9 is omitted, there is a possibility that it may become impossible to maintain the quality of the signal waveform of the final differential output signals OUTP and OUTM.

Figure 3:
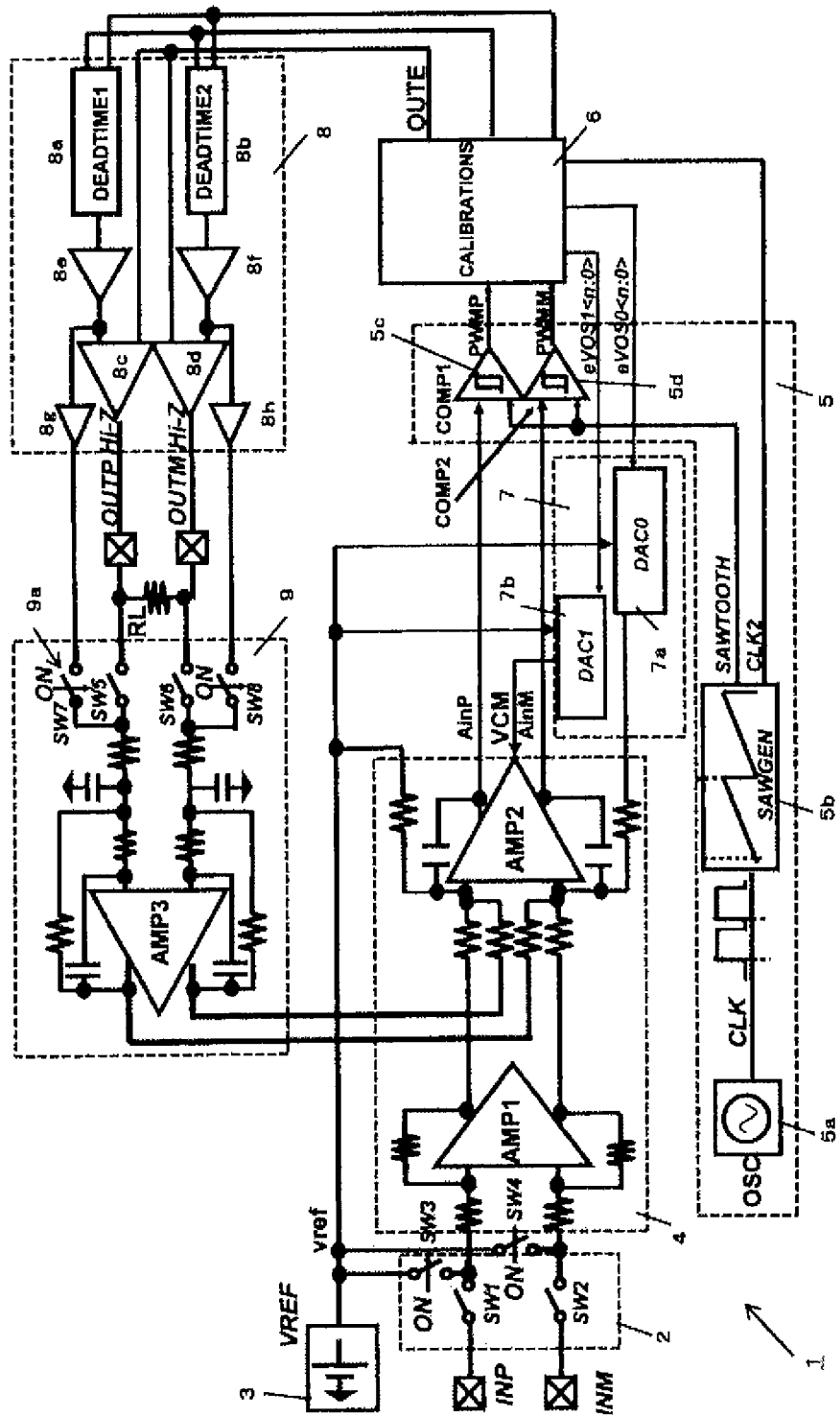
FIG. 3 shows c changing states between an input switching unit and an input selection unit at the time of calibration.

FIG. 3 is a figure demonstrating the switching state of the input switching unit 2 and the input selection unit 9a at the time of calibration. In this switching state, the input switching unit 2 is switched so that only the reference voltage signal Vref may be input into the front-end amplifier AMP1 of the pre-feedback unit, and the input selection unit 9a is switched so that the input signal of the main drivers 8c and 8d in the power amplification unit 8 may be input into the feedback amplifier AMP3.

Thus, at the time of calibration, the signal loop circuit includes the preamplifier unit 4, the PWM conversion unit 5, the power amplification unit 8, and the feedback amplification unit 9. At this time, the potential difference of the differential output signal (the AinP signal and the AinM signal) of the preamplifier unit 4 serves as the amount of the DC offset of this signal loop circuit. The amount of the DC offset is corrected by the analog offset adjustment signal with which digital-to-analog conversion of the digital offset adjustment signal eVOS0 <n:0> outputted from the calibration unit 6 is carried out by first DAC7a. Moreover, the shift from the differential output signal PWMP, signal of the PWM conversion unit 5, and duty 50% of PWMM signals, is corrected by the analog duty cycle adjustment signal in which digital-to-analog conversion is carried out by the second DAC7b from the digital duty adjustment signal eVOS1 <n: 0> output from the calibration unit 6.

Figure 4:
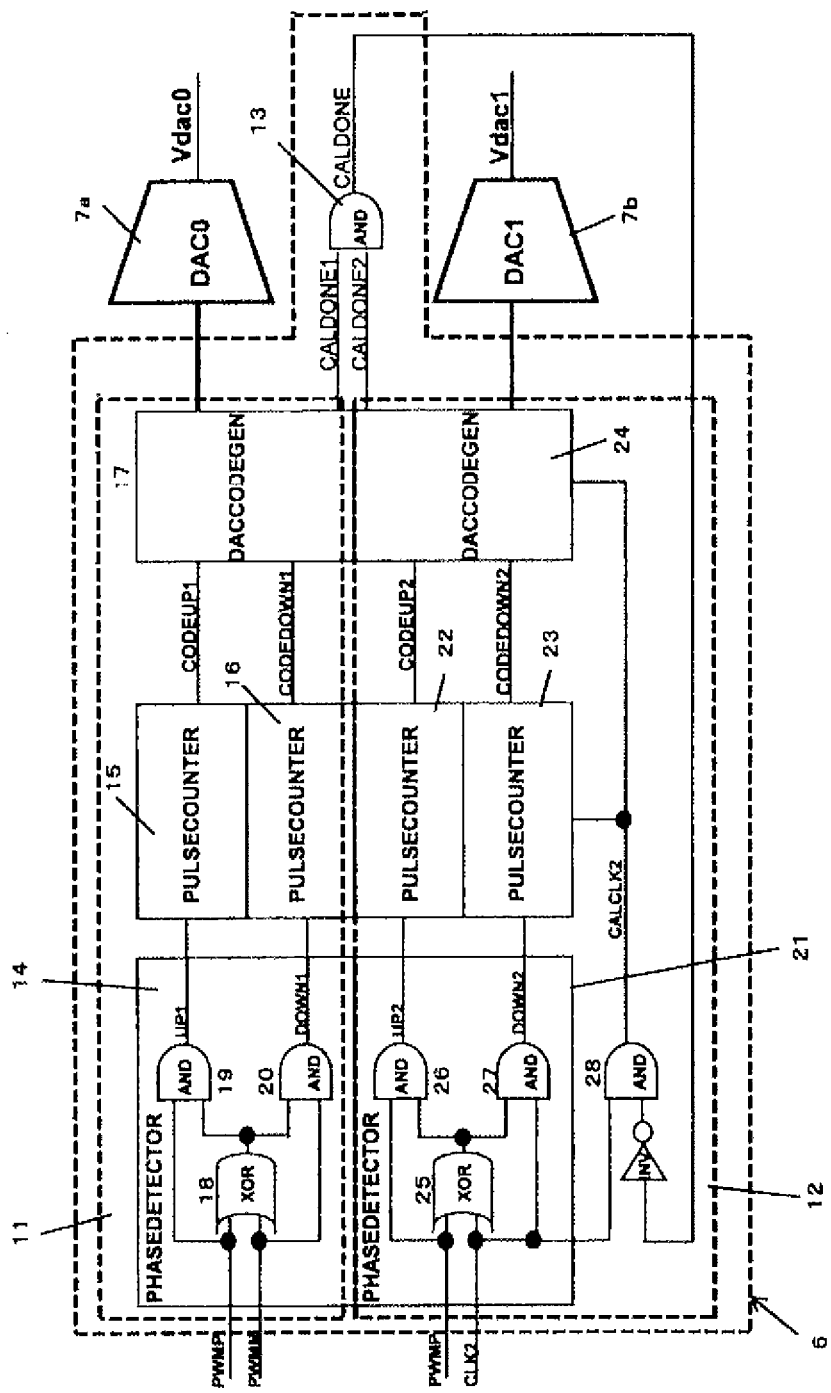
FIG. 4 is a block diagram showing an example of the internal configuration of a calibration unit.

FIG. 4 is a block diagram showing an example of the internal configuration of the calibration unit 6 and D/A converter 7 for calibration. The calibration unit 6 has an offset adjustment signal generation unit 11, a duty cycle adjustment signal generation unit 12, and a termination signal generation unit 13.

As shown in FIG. 4, the offset adjustment signal generation unit 11 has the first phase detector 14, the first and second pulse counters 15 and 16, and the digital offset adjustment signal output unit 17.

The first phase detector 14 has XOR circuit 18 which generates the phase difference signal between two kinds of PWMP signals generated in the PWM conversion unit 5, and a PWMM signal, and first and second AND circuits 19 and 20 that generate the signal which shows the direction of the phase difference. The first AND circuit 19 will generate a pulse-like UP1 signal, if a PWMP signal has a pulse width larger than a PWMM signal. The second AND circuit 20 will generate a pulse-like DOWN1 signal, if a PWMM signal has a pulse width larger than a PWMP signal.

The first pulse counter 15 will count up whenever the UP1 signal is output from the first AND circuit 19. The second pulse counter 16 will count up whenever the DOWN1 signal is output from second AND circuit 20.

The first and second pulse counters 15 and 16 will output a carry signal (CODEUP1 signal, CODEDOWN1 signal), respectively, if a counter value turns into a predetermined value.

The digital offset adjustment signal output unit 17 changes the signal level of the digital offset adjustment signal one step at a time, whenever CODEUP1 and CODEDOWN1 signals are output from the first and second pulse counters 15 and 16.

The first DAC7a carries out D/A conversion of the digital offset adjustment signal to an analog offset adjustment signal, and supplies it to the input side of back-end amplifier AMP2 in the preamplifier unit 4.

If the signal level of a digital offset adjustment signal turns into the minimum level, the digital offset adjustment signal output unit 17 will make a high CALDONE1 signal which shows the calibration of the offset adjustment after the predetermined period elapses, since being set to the minimum level.

As shown in FIG. 4, the duty adjustment signal generation unit 12 has the second phase detector 21, the third and fourth pulse counters 22 and 23, and the digital duty adjustment signal output unit 24.

The second phase detector 21 has XOR circuit 25 which generates the phase difference signal between the reference clock signal CLK2 with the same duty as the PWMP signal and a sawtooth wave signal which are generated in the PWM conversion unit 5, and third and fourth AND circuits 26 and 27 which generate the signal which shows the direction of phase difference. If a PWMP signal has a pulse width larger than CLK2 signal, the third AND circuit 26 will generate a pulse-like UP2 signal. If CLK2 signal has a pulse width larger than the PWMP signal, the fourth AND circuit 27 will generate a pulse-like DOWN2 signal.

The third pulse counter 22 will count up whenever UP2 signal is output from the third AND circuit 26. The fourth pulse counter 23 will count up whenever DOWN2 signal is output from fourth AND circuit 27.

If a count value becomes a predetermined value, the third and fourth pulse counters 22 and 23 will output the carry signals (CODEUP2 signal, CODEDOWN2 signal), respectively.

The digital duty cycle adjustment signal output unit 24 changes the signal levels of the digital duty cycle adjustment signal one step at a time, whenever CODEUP1 signal, and CODEDOWN1 signal are output from the third and fourth pulse counters 22, 23.

If the signal level of a digital duty adjustment signal becomes the minimum level, the digital duty cycle adjustment signal output unit 24 will make the CALDONE2 signal which shows that the calibration of duty cycle adjustment is completed after the predetermined period elapses.

The second DAC7b carries out D/A conversion of the digital duty cycle adjustment signal to an analog adjustment signal, and supplies the signal to the VCM terminal of the back-end amplifier AMP2 in the preamplifier unit 4.

The termination signal generation unit 13 of calibration makes the CALDONE signal high, which shows that calibration of the calibration unit 6 is completed, when both end signal CALDONE1 of offset correction and end signal CALDONE2 of duty cycle correction are high. If this CALDONE signal becomes high, the reference clock CLK2 signal input into the calibration unit 6 is compulsorily stopped by an AND circuit, and the calibration unit 6 stops calibration operation, and holds the offset adjustment signal and duty adjustment signal as they existed just as calibration was completed. Then, the CALDONE signal becomes high, an OUTE signal becomes high, the switching unit 2 of FIG. 1 is switched over, and the amplification circuit 1 performs the usual class D amplification operations.

Figure 5:
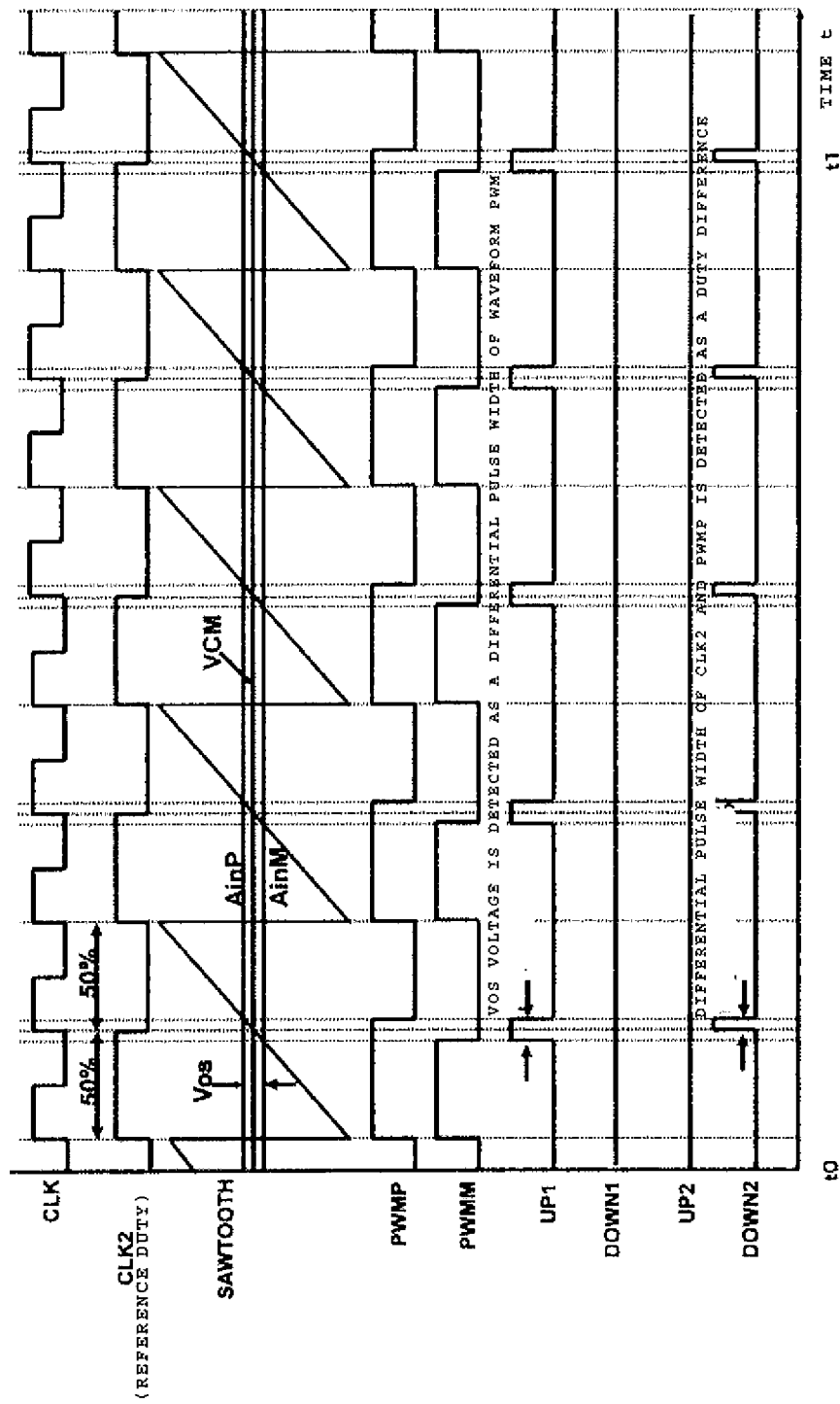
FIG. 5 is a signal waveform diagram of DC offset voltage, PWM signal, UP1 signal, DOW1 signal, UP2 signal, and DOWN2 signal at the time of calibration.

FIG. 5 illustrates each signal waveform diagram of DC offset voltage, a PWM signal, UP1 signal, DOW1 signal, and UP2 signal and DOWN2 signal at the time of calibration.

Even if the reference voltage signal Vref of the same voltage level is input to both of the difference input terminals INP and INM of the front-end amplifier AMP1 in the preamplifier unit 4, the voltage level of the differential output voltages AinP and AinM of the back-end amplifier AMP2 may not be equal because of different the DC offset amounts of each unit.

In order for the PWM conversion unit 5 to generate the PWM signal (a PWMP signal and a PWMM signal) according to the voltage difference between the differential output voltages AinP and AinM of the back-end amplifier AMP2 within preamplifier unit 4 and a sawtooth wave signal, if there is a shift in the voltage level of the differential output voltages AinP and AinM, a shift will also be generated in the pulse width of the PWMP signal and the PWMM signal.

In the example of FIG. 5, since the pulse width of the PWMP signal is larger than a PWMM signal, the UP1 signal for the pulse width is generated by the first AND circuit 19 in the calibration unit 6. Moreover, since the PWMP signal pulse width is larger than the reference clock CLK2 signal, the DOWN2 signal of the pulse width is generated by the fourth AND circuit 27 in the calibration unit 6.

Figure 6:
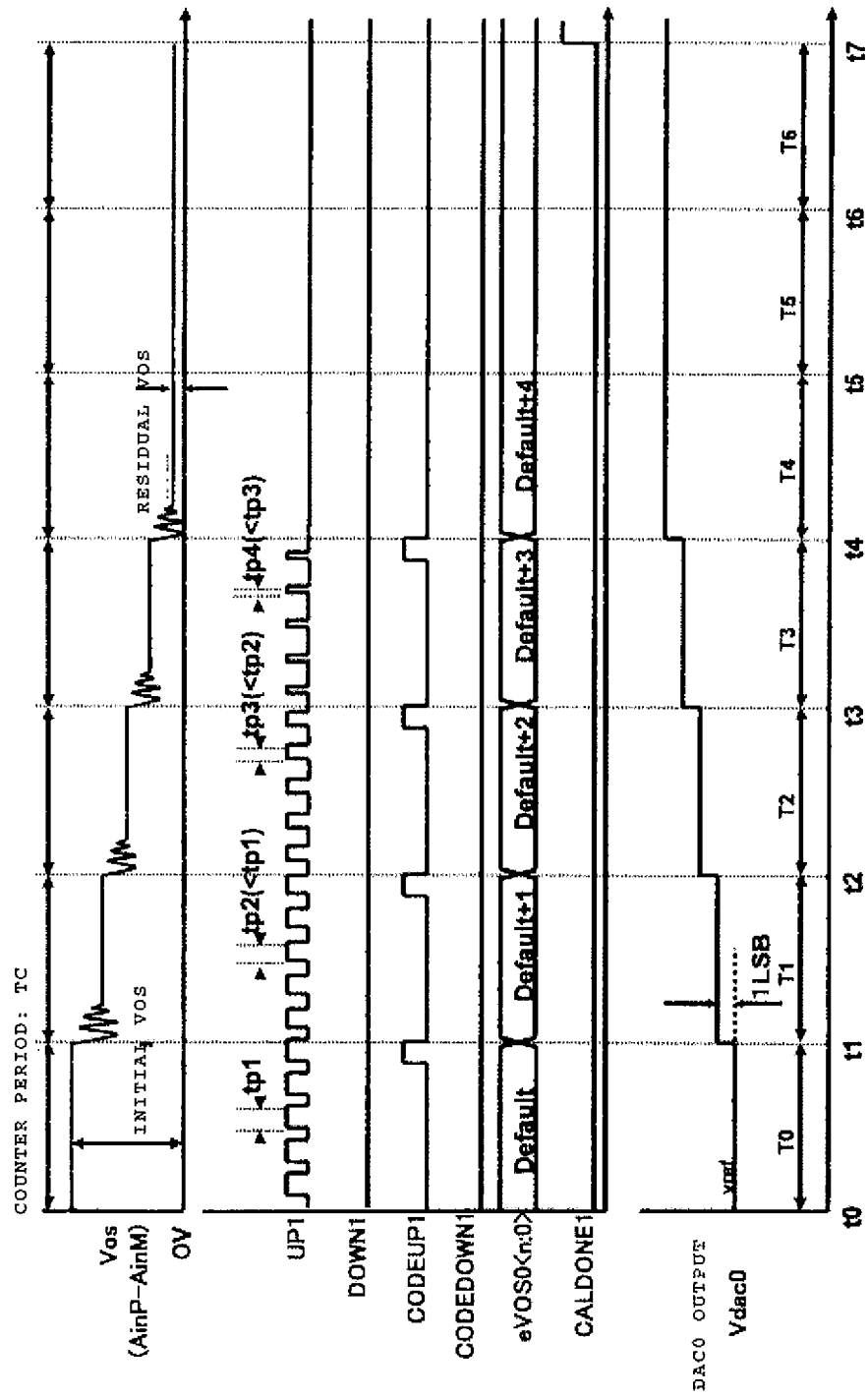
FIG. 6 is a signal waveform diagram of each unit in the case of performing DC offset correction in a calibration unit.

FIG. 6 is a signal waveform diagram of each unit in the case of performing the DC offset correction in the calibration unit 6. FIG. 6 shows 5 cycles of t0-t1 of FIG. 5 as one section. The DAC code is set up so that the output voltage Vdac0 of first DAC7a in the time to of FIG. 6 becomes the same voltage as the reference voltage Vref generated by the reference voltage generator 3.

As shown in FIG. 5, if pulse-like UP1 signal is output continuously 5 times, as shown in FIG. 6, the first pulse counter 15 in the calibration unit 6 will output a pulse-like CODEUP1 signal. Whenever the CODEUP1 signal is output, the digital offset adjustment signal generation unit 11 raises the signal levels of the digital offset adjustment signal one level at a time. In the example of FIG. 6, the pulse-like CODEUP1 signal is output continuously 4 times, and the signal level of a digital offset adjustment signal is rising by a total of four levels.

After being converted into an analog offset adjustment signal by the first DAC7a, the digital offset adjustment signal returns to one side of the difference input terminal on the back-end amplifier AMP2 in the preamplifier unit 4, as shown in FIG. 1. Thus, as shown in FIG. 6, whenever one level of the digital offset adjustment signal changes at a time, the voltage difference of the differential input signal of the back-end amplifier AMP2 in the preamplifier unit 4 also changes one step at a time, and it is corrected so that any voltage difference may be lost gradually.

After time t4 of FIG. 6, the voltage difference of the differential output signals AinP and AinM of the back-end amplifier AMP2 in the preamplifier unit 4 approaches zero, and any DC offset correction is ended at this time. The CALDONE1 signal output from the digital offset adjustment signal output unit 17 of FIG. 4 becomes high at the time t7 after 3 cycles of the voltage difference of the differential output signals AinP and AinM becomes zero.

Figure 7:
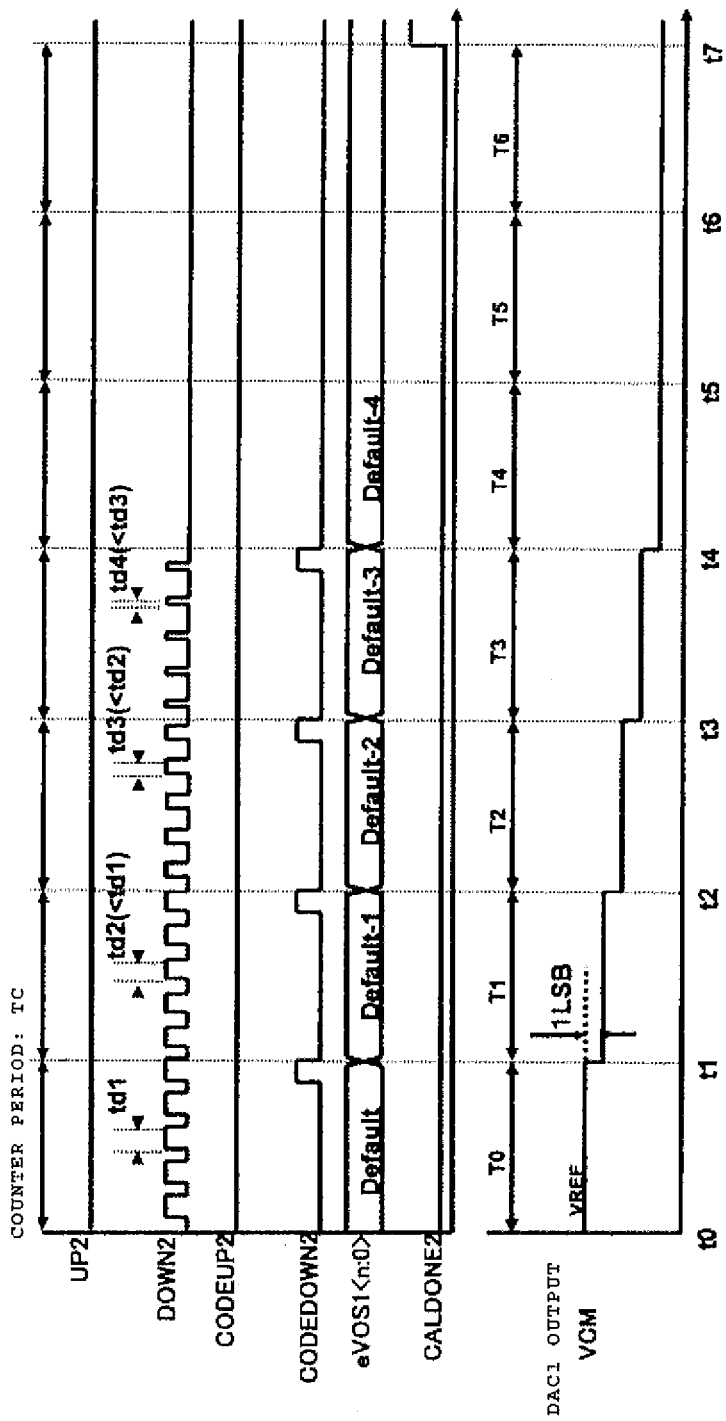
FIG. 7 is the signal waveform diagram of each unit in the case of performing duty correction in the calibration unit.

FIG. 7 is a signal waveform diagram of each unit in the case of performing duty correction in the calibration unit 6. FIG. 7 shows the signal waveform of each unit on the same time scale as FIG. 6. If a pulse-like DOWN2 signal is continuously output 5 times as shown in FIG. 5, as shown in FIG. 7, the fourth pulse counter 23 in the calibration unit 6 will output a pulse-like CODEDOWN2 signal. Whenever a CODEDOWN2 signal is output, one level of the signal levels of the digital duty adjustment signal is lowered at a time by the digital duty adjustment signal generation unit 12. In the example of FIG. 7, a pulse-like CODEDOWN signal is output continuously 4 times and the signal level of a digital duty adjustment signal falls by a total of four levels.

After being converted into an analog duty adjustment signal by second DAC7b, a digital duty adjustment signal returns to the VCM terminal of the back-end amplifier AMP2 in the preamplifier unit 4, as shown in FIG. 1. Thereby, the middle point of the operating point of the back-end amplifier AMP2 is corrected, and duty cycle correction is performed.

Figure 8A:
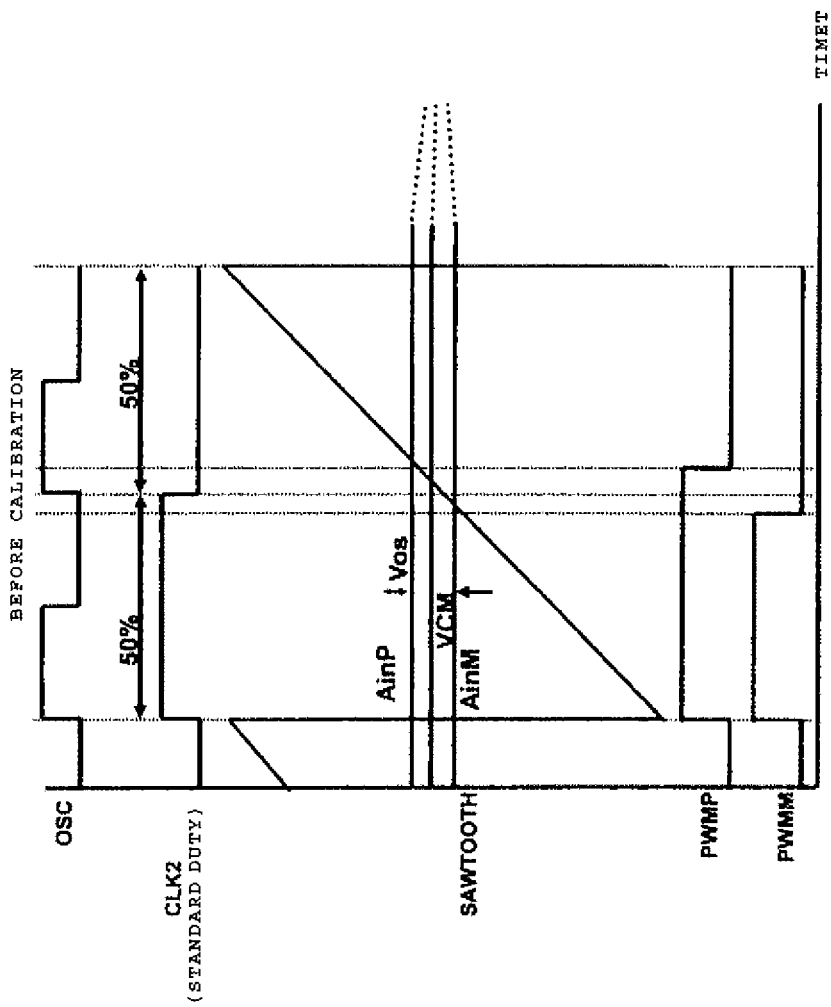
FIGS. 8A and 8B compare the voltage difference of differential output signals AinP and AinM of the back-end amplifier AMP2 before and after carrying out the calibration for DC offset correction and duty correction.
Figure 8B:
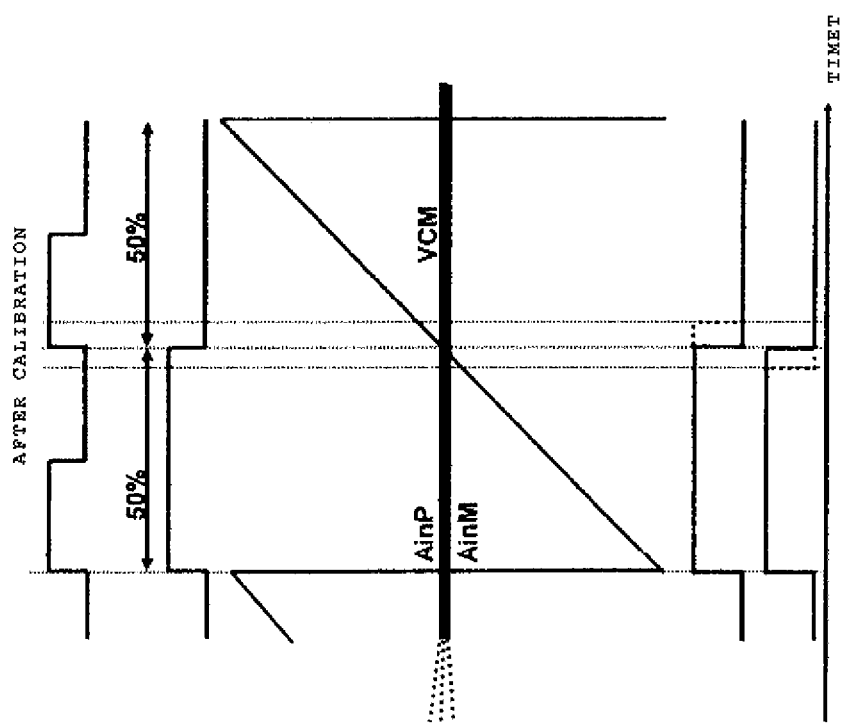

FIGS. 8A and 8B compare the voltage difference of the differential output signal AinP, AinM of the back-end amplifier AMP2 before and after carrying out calibration for DC offset correction and duty correction.

FIG. 8A shows the waveforms of the differential output signal AinP and AinMl and the waveform of the PWMP signal before calibration. Since the voltage level of the AinP signal is larger than an AinM signal, the PWMP signal pulse width became larger than the PWMM signal and the phase difference of a PWMP signal and reference clock CLK2 signal is shifted.

On the other hand, after calibration as shown in FIG. 8B, offset correction is performed so that the voltage level of an AinP signal and an AinM signal may become almost fixed. As a result of performing duty correction so that VCM voltage may fall, the shift of the phase difference of a PWMP signal and a PWMM signal is reset to zero, and the shift of phase difference between a PWMP signal and a reference clock CLK signal is recalibrated to zero.

Thus, in the first embodiment, in order to perform DC offset correction and the duty correction in the amplifier circuit 1 of a class D amplifier, the calibration unit 6 is prepared. Calibration occurs during the time INP and INM signals are switched off from the input terminals of the amplifier 1 (during mute periods), and calibration is performed by inputting a reference signal into both terminals.

At the time of calibration, the phase difference of a differential PWMP signal and a PWMM signal which the PWM conversion unit 5 has generated is detected, the offset adjustment signal according to phase difference is returned to the input side of the back-end amplifier AMP2 in the preamplifier unit 4. Therefore, DC offset which occurred by various factors in the amplifier circuit 1 can be reduced.

Moreover, at the time of calibration, the phase difference of a PWMP signal and the reference clock CLK2 signal is detected, the duty adjustment signal according to phase difference is returned to back-end amplifier AMP2 in the preamplifier unit 4, and the middle point of the operating point of the back-end amplifier AMP2 is corrected. Thereby, duty correction of a PWMP signal and a PWMM signal can be performed.

The offset adjustment signal and duty adjustment signal are determined according to the procedure mentioned above. Once calibration is carried out, the subsequent amplification operation of class D amplifier can be performed.

Embodiment 2

In the first embodiment, although the sawtooth wave signal is input into the PWM conversion unit 5, a triangular wave signal may also be input. By the sawtooth wave signal and the triangular wave signal, the output of the high order component differs and generally it is considered that the high order component of the triangular wave signal is small and distortion of a PWM signal is small. The second embodiment is characterized in that a triangular wave signal is input into the PWM conversion unit 5.

Figure 9:
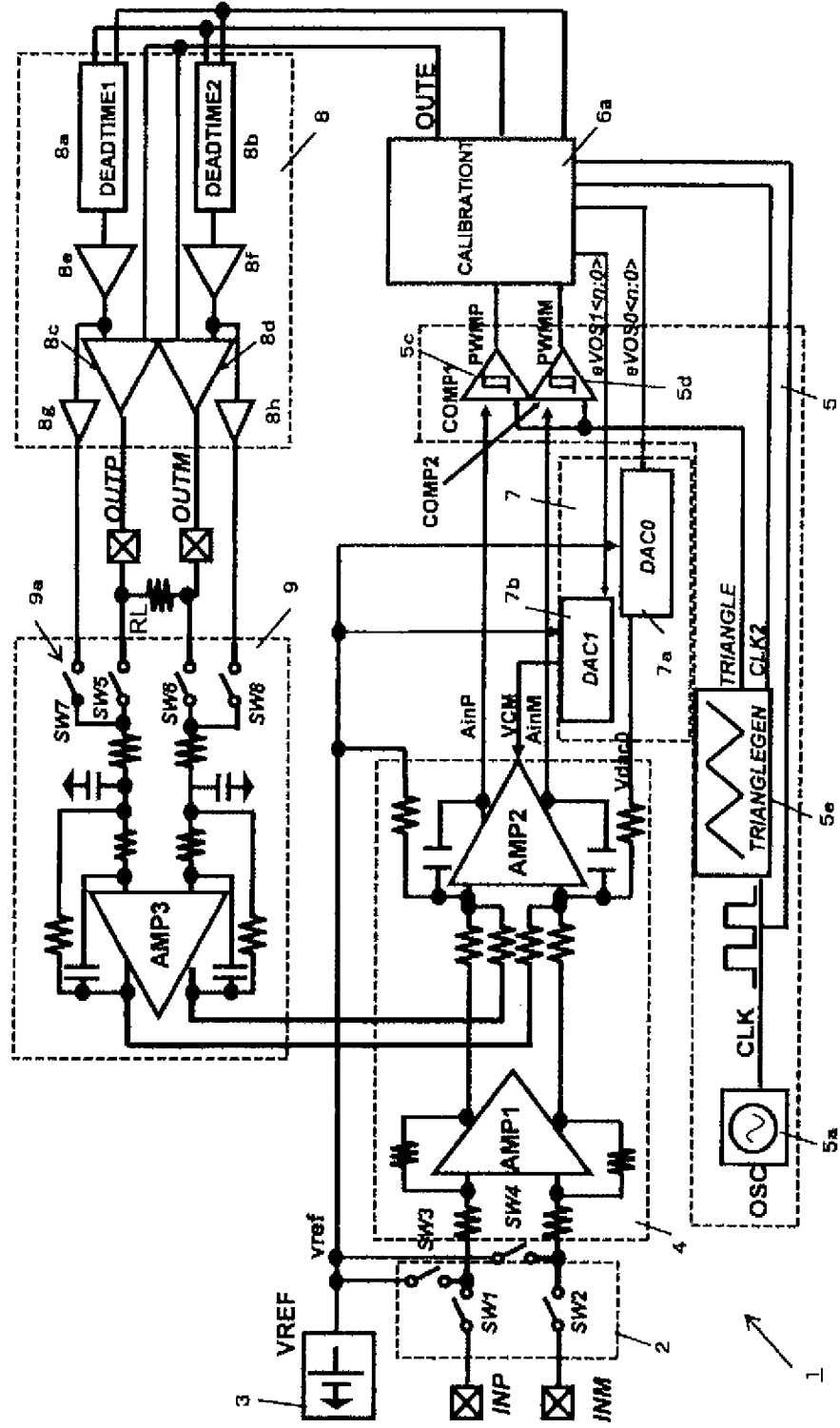
FIG. 9 is a block diagram showing the schematic structure of an amplifier circuit according to a second embodiment.
Figure 10:
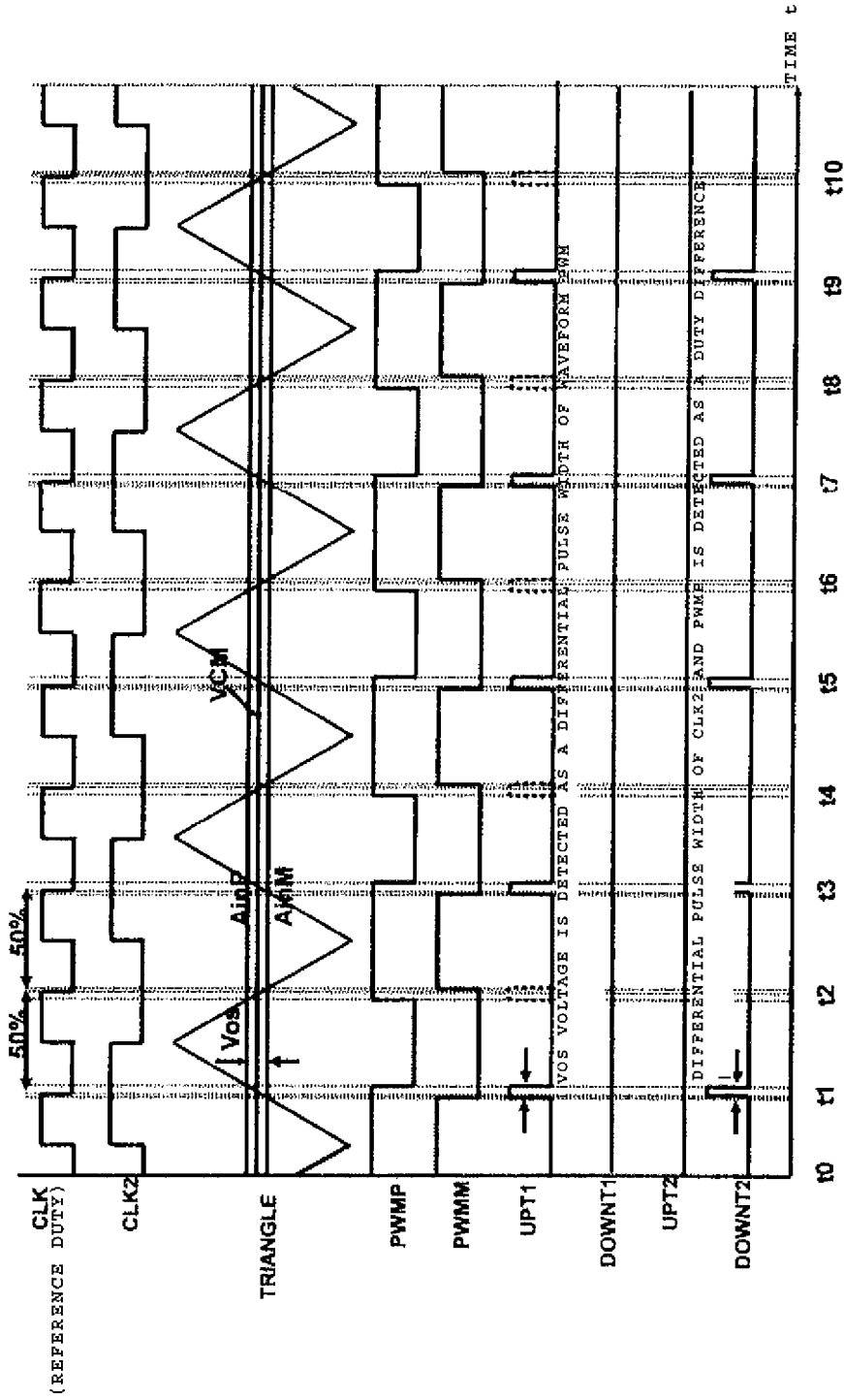
FIG. 10 is a signal waveform diagram of each unit in the amplifier circuit of FIG. 9.

FIG. 9 is a block diagram showing a schematic configuration of an amplifier circuit 1 according to the second embodiment and FIG. 10 is a diagram showing a signal waveform of each unit in the amplifier circuit 1 of FIG. 9. The amplifier circuit 1 of FIG. 9 differs from the amplifier circuit 1 of FIG. 2 in that a triangular wave signal generator 5e is used instead of the sawtooth wave signal generator 5b in the PWM conversion unit 5.

The first comparator 5c and the second comparator 5d compare the differential input signals AinP, AinM output from the preamplifier unit 4 and the triangular wave signal output from the triangular wave signal generator 5e, and output the PWMP signal and PWMM signal according to the voltage difference of both signals, respectively.

A sawtooth wave signal is provided with only the slanting domain going up for every cycle, as shown in FIG. 5. In contrast, the triangular wave signal is provided with slanting domain going up and going down for every cycle as shown in FIG. 10.

In the first embodiment, within the uphill slanting domain period of a sawtooth wave, the potential difference comparison with the differential output signals AinP, AinM of the preamplifier unit 4 is performed. If potential difference comparison with the differential output signals AinP and AinM of the preamplifier unit 4 is performed within an uphill slanting period of triangular wave signal at the second embodiment, sharing of the operation timing of the amplifier circuit 1 can be attained.

During the down slanting domain period of the triangular wave signal, calibration operations are not performed in the amplifier circuit 1 of FIG. 9.

Figure 11:
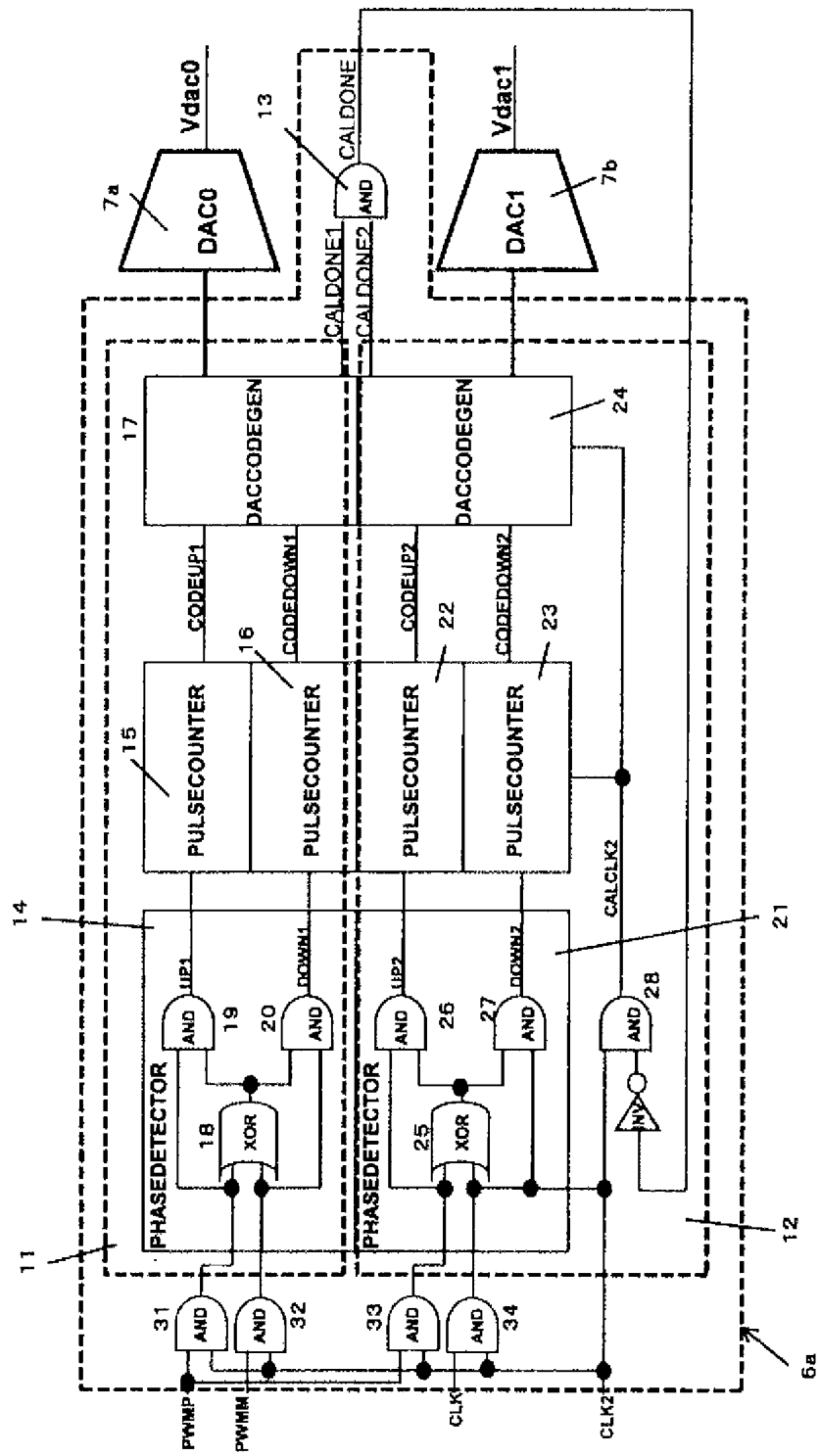
FIG. 11 is a block diagram showing the internal configuration of the calibration unit of the second embodiment.

FIG. 11 is a block diagram showing the internal configuration of the calibration unit 6a concerning the second embodiment. The calibration unit 6a of FIG. 11 has 4 AND circuits 31-34 in addition to the configuration of calibration unit 6 of FIG. 4. These AND circuits 31-34 supply a PWMP signal, a PWMM signal, and a reference clock CLK signal to the first phase detector 14 and the second phase detector 21, only when reference clock CLK2 signal is at a high level.

Thus, as shown in the time t2, t4, t6, t8, and t10 of FIG. 10, both UPT1 signal which should be output from the first phase detector 14 within the period of a low level by reference CLK2 signal, and DOWNT2 signal which should be output from the second phase detector 21 within the period of a low level by the reference CLK2 signal are not present, such that calibration can only be performed during the increasing voltage time periods of the triangular wave.

Thus, in the second embodiment, since a triangular wave signal is use and not a sawtooth wave signal, when changing the differential output signal from the preamplifier unit 4 into a PWM signal, distortion can be decreased at a PWM signal. Moreover, timing of the operation can be communalized when a calibration is performed using a sawtooth wave signal because the PWM conversion unit 5 in the second embodiment generates a PWM signal using only the uphill slanting domain of the triangular wave signal at the time of calibration. Therefore, there is little circuit change from the amplifier circuit 1 of FIG. 1.

(Other Modifications)

Although the first and second embodiment, as explained, perform DC off set correction and duty correction of a PWM signal in parallel at the time of calibration only one of DC offset correction or duty correction may be performed. For example, when performing only DC offset correction, the duty adjustment signal generation unit 12 in 6a and second DAC7b in the calibration unit 6, 6a of FIG. 4 and FIG. 11 can be omitted. Moreover, when performing only duty correction, the offset adjustment signal generation unit 11 of FIG. 4 and FIG. 11 and first DAC7a can be omitted.

In the first and second embodiments, although explained using the amplifier circuit 1 of the class D amplifier, the embodiment is also applicable to the amplifier circuit 1 of the class BD amplifier which amplifies the phase difference signal of a PWMP signal and a PWMM signal. What is necessary is to supply UP1 signal and DOWN1 signal of FIG. 4 to the electric power amplifier unit B instead of supplying a PWMP signal and a PWMM signal to the electric power amplifier unit 8 in the case of the amplifier circuit 1 of the class BD amplifier.

While certain embodiments have been described, these embodiments have been presented by way of example only, and are not intended to limit the scope of the inventions. Indeed, the novel embodiments described herein may be embodied in a variety of other forms. Furthermore, various omissions, substitutions, and changes in the form of the embodiments described herein may be made without departing from the spirit of the invention. The accompanying claims and their equivalents are intended to cover such forms or modifications as would fall within the scope and spirit of the invention.

What is claimed is:

1. An amplifier circuit comprising:
   an input switching unit which outputs a reference voltage signal as a differential input signal;
   a preamplifier unit which amplifies the differential input signal and generates a differential output signal;
   a PWM conversion unit which generates a differential PWM signal based on a comparison of the differential output signal with a reference signal of a sawtooth or triangular waveform;
   a calibration unit which generates an offset adjustment signal according to a phase difference of the differential PWM signal at a time of calibration; and
   an electric amplifier unit which carries out electric power amplification of the differential PWM signal, and generates a differential final output signal, wherein
   the calibration unit adjusts a voltage level of the differential output signal based on the offset adjustment signal so that the voltage difference of the differential output signal may become smaller at the time of calibration.

2. The amplifier circuit according to claim 1, further comprising:

a D/A converter which converts the offset adjustment signal into an analog offset adjustment signal during calibration;
wherein
the calibration unit adjusts the voltage level of the differential output signal based on the analog offset adjustment signal so that the voltage difference of the differential output signal may become smaller at the time of calibration.

3. The amplifier circuit according to claim 1, wherein
the calibration unit comprises:
a phase difference detection unit which detects a direction of the phase difference of the differential PWM signals for every cycle of the reference signal;
first and second phase-difference-detection counters which measure the number of times a difference between the differential PWM signals and the reference signal is detected; wherein
the first phase-difference-detection counter increments by a value of one whenever the phase of one of the differential PWM signals lags the other of the differential PWM signals, and the second phase-difference-detection counter increments by a value of one whenever the phase of one of the differential PWM signals leads the other one of the differential PWM signals.

4. The amplifier circuit according to claim 3, wherein
the calibration unit raises the offset adjustment signal by one level if the measurement value of the first phase-difference-detection counter reaches a predetermined value, and the offset adjustment signal will be reduced by one level if the measurement value of the second phase-difference-detection counter reaches the predetermined value.

5. The amplification circuit according to claim 1, wherein the calibration unit generates the offset adjustment signal only during an increasing voltage period of the reference signal.

6. The amplification circuit according to claim 5, wherein the reference signal has the sawtooth waveform.

7. The amplification circuit according to claim 5, wherein the reference signal has the triangular waveform.

8. The amplification circuit according to claim 1, further including a deadtime circuit configured to prevent current flows between a power supply terminal and a ground terminal.

9. The amplification circuit according to claim 1, further comprising:
a feedback amplifier unit which performs gain adjustment of the differential final output signal and generates a differential feedback signal, wherein
the differential feedback signal and the differential input signal are input to the preamplifier unit.

10. The amplification circuit according to claim 7, wherein:
the calibration unit includes a plurality of AND circuits configured to receive a reference clock signal that indicates the reference signal is in a period of increasing voltage, and the differential PWM signal and the reference signal are output from the plurality of AND circuits only when the reference clock signal indicates the reference signal is in a period of increasing voltage.

11. A method of calibrating a PWM amplification circuit, comprising;
establishing a reference voltage signal;
establishing a reference signal having one of a sawtooth waveform and triangular waveform;
providing the reference voltage signal as a differential input signal to a preamplifier unit that generates a differential output signal from the differential input signal;
generating a differential pulse-width-modulated (PWM) signal based on a comparison of the differential output signal with the reference signal;
generating an offset adjustment signal according to a phase difference of the differential PWM signal; and
adjusting a voltage level of the differential output signal based on the offset adjustment signal so that a voltage difference of the differential output signal becomes smaller.

12. The method of calibration of claim 11, wherein the comparison of differential output signal to the reference signal occurs only during a period of increasing voltage of the reference signal.

13. The method of calibration of claim 12, wherein a clock circuit providing a clock signal is used to establish the reference signal.

14. The method of calibration of claim 11, wherein two differential output signals are generated by the preamplifier unit.

15. The method of calibration of claim 14, wherein a DC offset between the two differential output signals is detected.

16. The method of calibration of claim 15, wherein a phase of one of the two differential output signals is shifted to correspond to a phase of a clock signal.

17. The method of calibration of claim 11, further including:
amplifying the differential PWM signal to generate a differential final output signal; and
performing a gain adjustment on the differential final output signal in a feedback amplifier unit to thereby generate a differential feedback signal, wherein
the differential feedback signal and the reference voltage signal are input to the preamplifier unit.

18. An amplifying circuit having an internal calibration capability for calibrating the phase of an amplified output signal thereof, comprising:
a preamplifier configured to amplify a first input signal and a second input signal, and thereby generate a first output signal and a second output signal;
an input switch unit, which sets a input signal as the configured to provide a reference voltage signal to the preamplifier as the first and second input signals at a time of calibration;
a PWM conversion unit configured to carry out Pulse-Width-Modulation of the first and second output signals, and to generate a first pulsed-width-modulated signal by comparing the first output signal with a reference signal, and to generate a second pulse-width-modulated signal by comparing the second output signal to the reference signal, the reference signal comprising at least one of a sawtooth wave and a triangular wave;
a calibration unit configured to generate an offset adjustment signal based upon a phase difference between the first and second pulse-width-modulated signals during calibration; and
an electric amplifier configured to amplify the first and second pulse-width-modulated signals, and to thereby generate a first final output signal and a second final output signal;
wherein, the preamplifier is configured to adjust a voltage level of the first and second output signals based on the offset adjustment signal such that the voltage difference between the first and second output signals will be lower after calibration.

19. The amplifying circuit of claim 18, wherein the calibration unit is configured to generate a duty cycle adjustment signal based on a phase difference between a one of the first and second pulse-width-modulated signals and a reference clock signal that corresponds to voltage level changes of the reference signal, and the preamplifier is configured to adjust a phase of at least one of the first and second output signals to correspond to a phase of the reference clock signal.

* * * * *